United States Patent
Chae et al.

(10) Patent No.: US 11,519,952 B2
(45) Date of Patent: *Dec. 6, 2022

(54) ARC DETECTION METHOD AND APPARATUS USING STATISTICAL VALUE OF ELECTRIC CURRENT

(71) Applicant: Korea Institute of Energy Research, Daejeon (KR)

(72) Inventors: Su Yong Chae, Daejeon (KR); Mo Se Kang, Daejeon (KR); Kuk Yeol Bae, Daejeon (KR); Suk In Park, Daejeon (KR); Hak Geun Jeong, Daejeon (KR); Gi Hwan Yoon, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/500,944

(22) Filed: Oct. 14, 2021

(65) Prior Publication Data
US 2022/0065916 A1 Mar. 3, 2022

Related U.S. Application Data

(63) Continuation of application No. 16/841,676, filed on Apr. 7, 2020, now Pat. No. 11,181,569.

(30) Foreign Application Priority Data

Feb. 14, 2020 (KR) .......................... 10-2020-0018390

(51) Int. Cl.
*G01R 31/12* (2020.01)

(52) U.S. Cl.
CPC .................. *G01R 31/1272* (2013.01)

(58) Field of Classification Search
CPC . G01R 31/1272; G01R 21/006; G01R 21/133
See application file for complete search history.

(56) References Cited

U.S. PATENT DOCUMENTS

| | | | | |
|---|---|---|---|---|
| 2007/0299798 | A1* | 12/2007 | Suyama | G06F 17/18 706/21 |
| 2016/0202304 | A1* | 7/2016 | Beierschmitt | H02H 3/10 324/750.01 |
| 2018/0062372 | A1* | 3/2018 | Lee | G01R 31/1272 |
| 2018/0250763 | A1* | 9/2018 | Kita | B23K 9/1006 |

FOREIGN PATENT DOCUMENTS

| | | |
|---|---|---|
| KR | 101692283 B1 | 1/2017 |
| KR | 102007319 B1 | 8/2019 |
| KR | 101993746 B1 | 9/2019 |
| WO | 0239561 A2 | 5/2002 |

* cited by examiner

*Primary Examiner* — Alvaro E Fortich
(74) *Attorney, Agent, or Firm* — Cantor Colburn LLP

(57) ABSTRACT

An embodiment of the present disclosure provides an arc detection method, in which an apparatus detects arcs, comprising the steps of: obtaining time series data for measured values of an electric current flowing in a wire; calculating first statistical values indicating dispersion degrees with time of the measured values or dispersion degrees with time of variances of the measured values from the time series data; and determining that an arc occurs in the wire or that the possibility of arc occurrence in the wire is high in a case when at least one of the first statistical values is out of a predefined range.

15 Claims, 18 Drawing Sheets

ARC DETECTION METHOD AND APPARATUS USING STATISTICAL VALUE OF ELECTRIC CURRENT

CROSS REFERENCE TO RELATED APPLICATION

This application is a continuation of U.S. patent application Ser. No. 16/841,676, filed on Apr. 7, 2020, which claims priority from Republic of Korea Patent Application No. 10-2020-0018390, filed on Feb. 14, 2020, which is hereby incorporated by reference in its entirety.

This research was supported by Technology Development Program to Solve Climate Changes through the National Research Foundation of Korea (NRF) funded by the Ministry of Science, ICT (2021M1A2A2043890).

BACKGROUND

1. Field of Technology

The present disclosure relates to a technology for detecting arcs.

2. Description of the Prior Art

When an electric current flows between two electrodes spaced apart or unstably in contact using gases as a medium, it is referred to as an arc.

The arcs may generally be classified into a series arc that occurs in one wire, a parallel arc that occurs between two wires, an earthing arc that occurs between a section of earth and one wire, and a cross arc that occurs between different networks.

When an arc occurs in an electric power system, this may cause trouble in some apparatuses. In particular, if such arcs are neglected and continuously occur, an electrical fire may break out due to the deterioration caused by an arc discharge. Therefore, it is necessary to detect arc occurrences early and to interrupt a relevant electric power system in order that any additional arcs do not occur.

The international publication No. WO2002/39561 discloses a technology for detecting arcs and interrupting an electric power system. However, this technology has a problem.

There are many cases in which an electric power system comprises a power converting device. According to the aforementioned technology, noises from a power converting device and arcs are not distinguishable. Therefore, even when the system operates normally, noises of the power converting device may be thought to be arcs.

SUMMARY OF THE INVENTION

In this background, an aspect of the present disclosure is to provide a technology for detecting arcs.

Another aspect of the present disclosure is to provide a technology for distinguishing arcs from noises generated in a normal operation.

Still another aspect of the present disclosure is to provide a technology of quick and accurate digital processing for arc detection.

To this end, a first embodiment of the present disclosure provides an arc detection method, in which an apparatus detects arcs, comprising the steps of: obtaining time series data for measured values of an electric current flowing in a wire; calculating first statistical values indicating dispersion degrees with time of the measured values or dispersion degrees with time of variances of the measured values using the time series data; and determining that an arc occurs in the wire or that the possibility of an arc occurrence in the wire is high in a case when at least one of the first statistical values is out of a predefined range.

The arc detection method may further comprise the steps of calculating average values of the first statistical values and second statistical values indicating dispersion degrees of the first statistical values; and establishing the predefined range having an upper and a lower boundaries by adding or subtracting values corresponding to predetermined times of the second statistical values to or from the average values.

In the step of calculating the first statistical values of the arc detection method, the first statistical values may be obtained by calculating standard deviation values for variances of the measured values of the electric currents for respective unit times.

In the step of calculating the first statistical values of the arc detection method, the first statistical values may be obtained by calculating standard deviation values for the measured values of the electric current to which a low-pass filter is applied.

In the step of calculating the first statistical values of the arc detection method, the first statistical values may be calculated from the time series data for every predetermined time period or in a moving window moving along a time axis.

According to the first embodiment, there is provided an arc detection apparatus comprising a sensing circuit to obtain time series data for measured values of an electric current flowing in a wire; and an arc determination circuit to calculate first statistical values indicating dispersion degrees with time of the measured values or dispersion degrees with time of variances of the measured values from the time series data and to determine that an arc occurs in the wire or that the possibility of an arc occurrence in the wire is high in a case when at least one of the first statistical values is out of a predefined range.

Through one side of the wire, switching noises of a power converting device may flow in.

The arc determination circuit may calculate average values of the first statistical values and second statistical values indicating dispersion degrees of the first statistical values and establish the predefined range having an upper and a lower boundaries by adding or subtracting values corresponding to K (K is a positive real number) times of the second statistical values to or from the average values.

The arc determination circuit may adjust a value of the K depending on the sizes of the average values.

The arc determination circuit may set a higher value for the K as the average values are lower.

The arc determination circuit may calculate the average values of the first statistical values and determine that the possibility of an arc occurrence in the wire is low in a case when a difference between a first average value calculated before a time point when at least one of the first statistical values is out of the predefined range and a second average value calculated after the time point is greater than a reference value.

The arc determination circuit may additionally determine the possibility of an arc occurrence by comparing a frequency analysis result of the measured values in a first time period before the time point when at least one of the first statistical values is out of the predefined range with a frequency analysis result of the measured values in a second time period after the time point.

The arc determination circuit may obtain the first statistical values by calculating standard deviation values for the measured values of the electric current to which a low-pass filter is applied.

The arc determination circuit may obtain the first statistical values by calculating standard deviation values for variances of the electric current for respective unit times.

To achieve the aforementioned object, a second embodiment provides an arc detection method in which an apparatus detects arcs, comprising steps of: obtaining time series data for measured values of an electric current flowing in a wire; generating N (N is a natural number, which is 2 or higher) pieces of frequency analysis data by performing N times or more of frequency analyses for time series data in different time periods; and determining that an arc occurs in the wire or that the possibility of an arc occurrence in the wire is high in a case when at least one of magnitude variation values of frequencies verified in the N pieces of frequency analysis data exceeds a reference value.

The arc detection method may further comprise a step of calculating statistical values regarding the dispersion or standard deviation values of magnitudes for respective frequencies in the N pieces of frequency analysis data, and determine that an arc occurs in the wire or the possibility of an arc occurrence in the wire is high in a case when at least one of the statistical values exceeds the reference value.

The arc detection method may further comprise the steps, before the step of generating the N pieces of frequency analysis data, of generating M (M is a natural number, which is 2 or higher) pieces of frequency analysis data by performing M times or more of frequency analyses for the time series data in different time periods; and generating the reference value by calculating magnitude variation values for respective frequencies using the M pieces of frequency analysis data.

According to the arc detection method, the reference value may be generated in a time period in which it has been determined that no arc occurs.

According to the arc detection method, the reference value may be generated within a predetermined time after a relevant apparatus has started operating.

According to the arc detection method, the M pieces of frequency analysis data may be generated using the time series data before a time point when an instantaneous value of the electric current is varied and the N pieces of frequency analysis data may be generated using the time series data after the time point.

According to the arc detection method, the M pieces of frequency analysis data may be generated using the time series data before the time point when at least one of the dispersion degrees of values corresponding to the electric current or the variances of the electric current is out of a predefined range (for example, when at least one of the first statistical values according to the first embodiment is out of the predefined range) and the N pieces of frequency analysis data may be generated using the time series data after the time point.

According to the arc detection method, the N pieces of frequency analysis data max he generated in time periods of the same size and not overlapping with each other.

The second embodiment provides an arc detection apparatus comprising: a sensing circuit to obtain time series data for measured values of an electric current flowing in a wire; and an arc determination circuit to generate N (N is a natural number, which is 2 or higher) pieces of frequency analysis data for the time series data by performing N times or more of frequency analyses in different time periods, and to determine that an arc occurs in the wire or the possibility of an arc occurrence in the wire is high in a case when at least one of magnitude variation values of respective frequencies verified in the N pieces of frequency analysis data exceeds a reference value.

Through one side of the wire, switching noises of a power converting device may flow in.

The arc determination circuit may generate the reference value by generating M (M is a natural number, which is 2 or higher) pieces of frequency analysis data by performing M times or more of frequency analyses for the time series data in a time period before an event is generated and calculating magnitude variation values for respective frequencies using the M pieces of frequency analysis data.

The event may be generated by a timer or an external signal.

The arc determination circuit may discern a variation of an instantaneous value of the electric current to generate the event.

The arc determination circuit may generate the event in a case when at least one of the dispersion degrees of values corresponding to the electric current or variances of the electric current is out of the predefined range (for example, at least one of the first statistical values according to the first embodiment is out of the predefined range).

The sensing circuit may generate the time series data using the measured values of the electric current to which a low-pass filter is applied.

As described above, according to the present disclosure, it is possible to detect arcs occurring in an electric power system and to stably interrupt the electric power system on this basis. In addition, according to the present disclosure, it is possible to distinguish noises generated in a normal operation from arcs so as to reduce the probability of the misdetection. In addition, according to the present disclosure, it is possible to quickly and accurately detect arcs using a new digital processing technology.

DETAILED DESCRIPTION OF THE EXEMPLARY EMBODIMENTS

Figure 1:
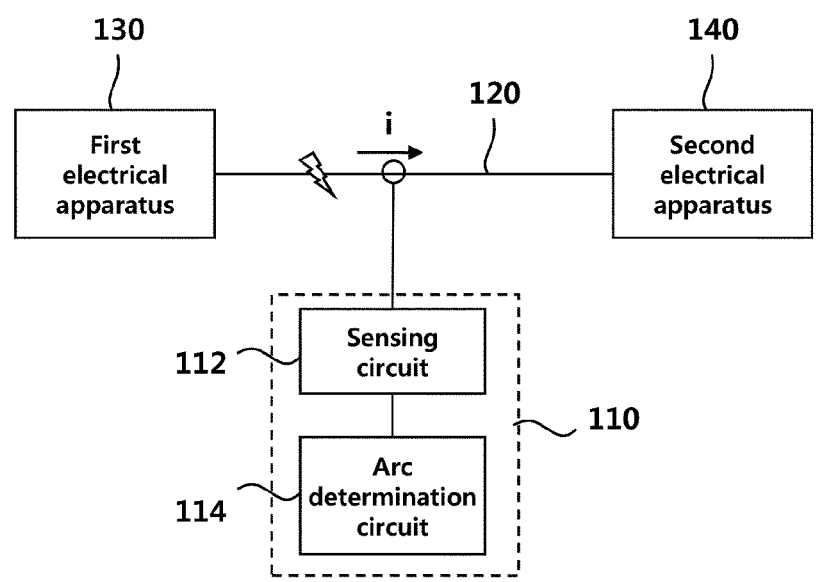
FIG. 1 is a configuration diagram of an electric power system according to embodiments of the present disclosure.

Hereinafter, embodiments of the present disclosure will be described in detail with reference to the accompanying drawings. It is noted that the same reference numeral will be used for the same element as much as possible, even when the element is shown in different drawings. Further, in the following description of the present disclosure, a detailed description of known functions and configurations incorporated herein will be omitted when it is determined that the description may make the subject matter of the present disclosure rather unclear.

In addition, terms, such as first, second, A, B, (a), (b) or the like may be used herein when describing components of the present disclosure. These terms are merely used to distinguish one structural element from other structural elements, and a property, an order, a sequence or the like of a corresponding structural element are not limited by the term. When it is described in the specification that one component is "connected," "coupled" or "joined" to another component, it should be read that the first component may be directly connected, coupled or joined to the second component, but also a third component may be "connected," "coupled," and "joined" between the first and second components.

FIG. 1 is a configuration diagram of an electric power system according to embodiments of the present disclosure.

Referring to FIG. 1, an electric power system 100 may comprise a first electrical apparatus 130 and a second electrical apparatus 140. The first electrical apparatus 130 and the second electrical apparatus 140 may be electrically connected with each other through a wire 120. The first electrical apparatus 130 may supply electric currents i to the wire 120 and the second electrical apparatus 140 may receive the electric currents i from the wire 120.

The first electrical apparatus 130 may comprise a power converting device. For example, the first electrical apparatus 130 may comprise a solar light power generating device as a power generating device and a power converting device to convert power produced in the solar light power generating device and to supply converted power to the wire 120. For another example, the first electrical apparatus 130 may comprise an energy storing device and a power converting device to convert power stored in the energy storing device and to supply converted power to the wire 120.

The power converting device comprised in the first electrical apparatus 130 may comprise a power semiconductor and convert power through a method of chopping the power using the power semiconductor. For example, the power converting device may be a buck converter, a boost converter, a flyback converter, or the like.

The power converting device comprised in the first electrical apparatus 130 may have a predetermined control frequency or a control frequency within a predetermined range. The control frequency may determine a period of the power chopping. Here, noises may be generated in the first electrical apparatus 130 and the wire 120 due to periodic chopping of power.

The second electrical apparatus 140 may comprise a power converting device. The power converting may be comprised either in the first electrical apparatus 130 or in the second electrical apparatus 140. Also, both the first electrical apparatus 130 and the second electrical apparatus 140 may respectively comprise power converting devices.

The first electrical apparatus 130 may comprise a device for supplying power (for example, a solar light power generating device, an energy storing device, or the like), whereas the second electrical apparatus 140 may comprise a power converting device to convert power supplied from the first electrical apparatus 130.

The power converting device comprised in the second electrical apparatus 140 may comprise a power semiconductor and convert power in a method of chopping power using the power semiconductor. For example, the power converting device may be a buck converter, a boost converter, a flyback converter, or the like.

The power converting device comprised in the second electrical apparatus 140 may have a predetermined control frequency or a control frequency within a predetermined range. The control frequency may determine a period of the power chopping. Here, noises may be generated in the second electrical apparatus 140 and the wire 120 due to periodic chopping of power.

An arc may occur in the wire 120 for a known or unknown reason. An arc detection apparatus 110 may detect an arc occurrence in the wire 120.

The arc detection apparatus 110 may comprise a sensing circuit 112 and an arc determination circuit 114.

The sensing circuit 112 may obtain measured values of an electric current i flowing in the wire 120. The sensing circuit 112 may generate time series data by measuring an electric current i flowing in the wire 120 using an electric current sensor.

The sensing circuit 112 may periodically measure the electric current i and store measured values in a time sequence in a memory as time series data. The sensing circuit 112 may generate time series data by storing the measured values of the electric current i as they are or by filtering or scaling the measured values.

The arc determination circuit 114 may determine if an arc occurs in the wire 120 by analyzing the time series data.

First Embodiment

The arc determination circuit 114 may calculate statistical values for an electric current i an analysis of the time series data and determine if an arc occurs in the wire 120 using such statistical values. The statistical values may be values indicating dispersion degrees of values corresponding to an electric current or variances of an electric current. The statistical values may be, for example, dispersion values or standard deviation values for an electric current. For another example, the statistical values may be dispersion values or standard deviation values for values corresponding to variances of an electric current. The arc determination circuit 114 may reduce the probability of the mis-determination of an arc using such statistical values. The utility of such statistical values will additionally be described below referring to FIG. 2 to FIG. 5.

Figure 2:
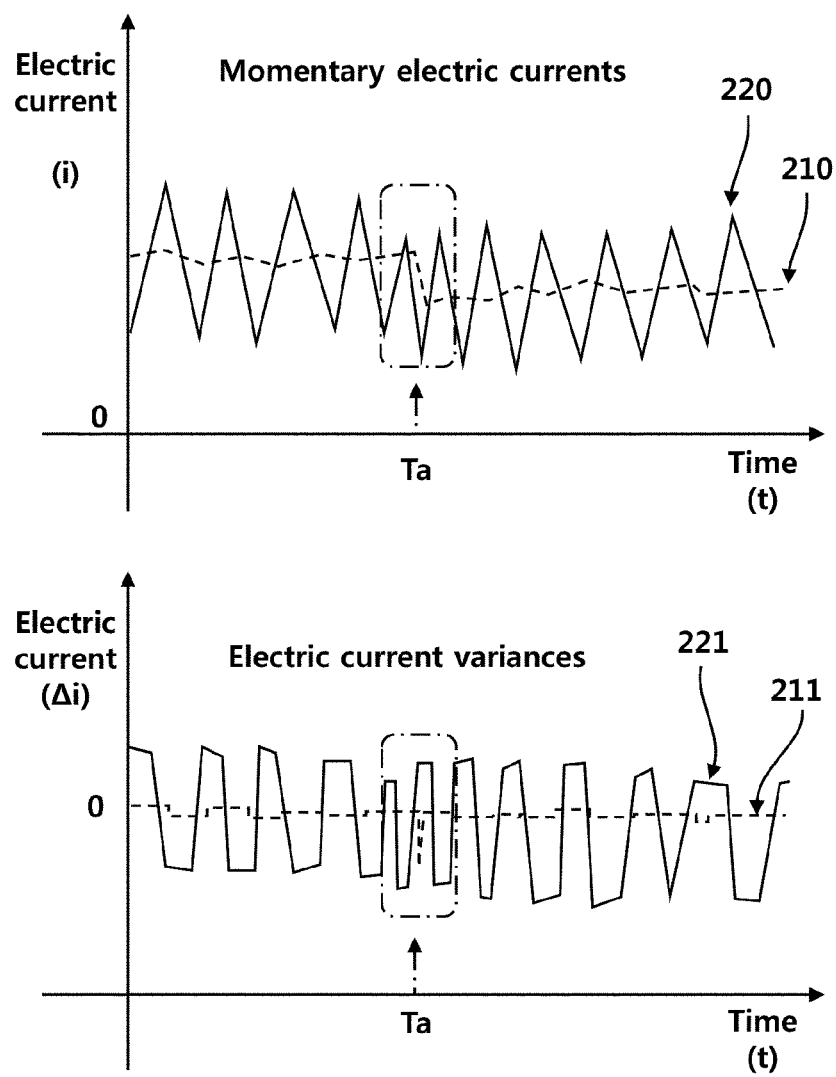
FIG. 2 is a diagram showing exemplary waveforms for an electric current flowing in a wire and variances of the electric current.

FIG. 2 is a diagram showing exemplary waveforms for an electric current flowing in a wire and variances of the electric current.

Generally, when an arc occurs in a wire, momentary currents i are varied in their sizes before and after a time point of an arc occurrence Ta as shown in a first waveform 210. When discerning such variations of the momentary currents i, an arc detection apparatus may determine an arc occurrence. In order to discern the variations of the momentary currents i, the arc detection apparatus may calculate variances Δi of electric currents. The arc detection apparatus may calculate the variances Δi of electric currents by calculating variances of momentary currents i for a predetermined time or by differentiating the momentary currents i.

When variances Δi of electric currents showing the first waveform 210 are calculated, a second waveform 211 may be obtained. Here, the arc detection apparatus may identify a time point when at least one of variances Δi of electric currents exceeds a reference value as a time point of an arc occurrence Ta.

However, it is highly likely that such general arc detection method mis-determines an arc occurrence when noises flow in a wire.

When switching noises of power converting device flow in through one side of the wire, the arc detection apparatus hardly discerns the size variations of the momentary currents i before and after the time point of an arc occurrence Ta due to the noises as shown in a third waveform 220. As shown in a fourth waveform 221 illustrating variances Δi of the electric currents of the third waveform 220, a difference between the variances Δi of the electric currents before and after the time point of an arc occurrence Ta is not great. Accordingly, even when using the variances Δi of the electric currents, it is difficult for the arc detection apparatus to determine an arc occurrence in the wire.

Figure 3:
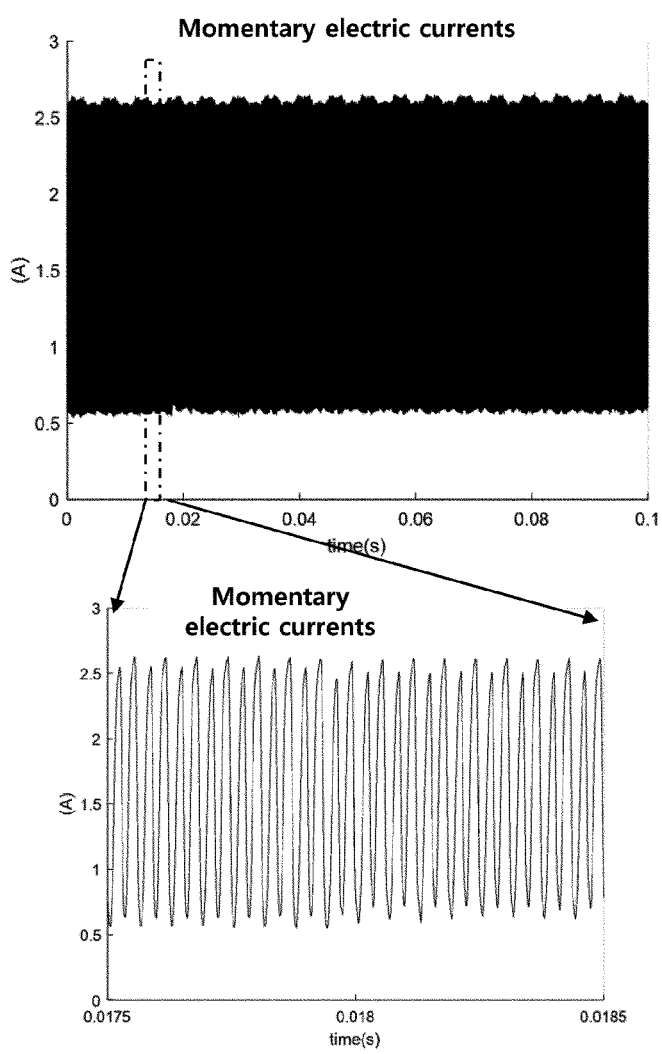
FIG. 3 is a diagram showing an electric current waveform in a wire where an arc occurs.
Figure 4:
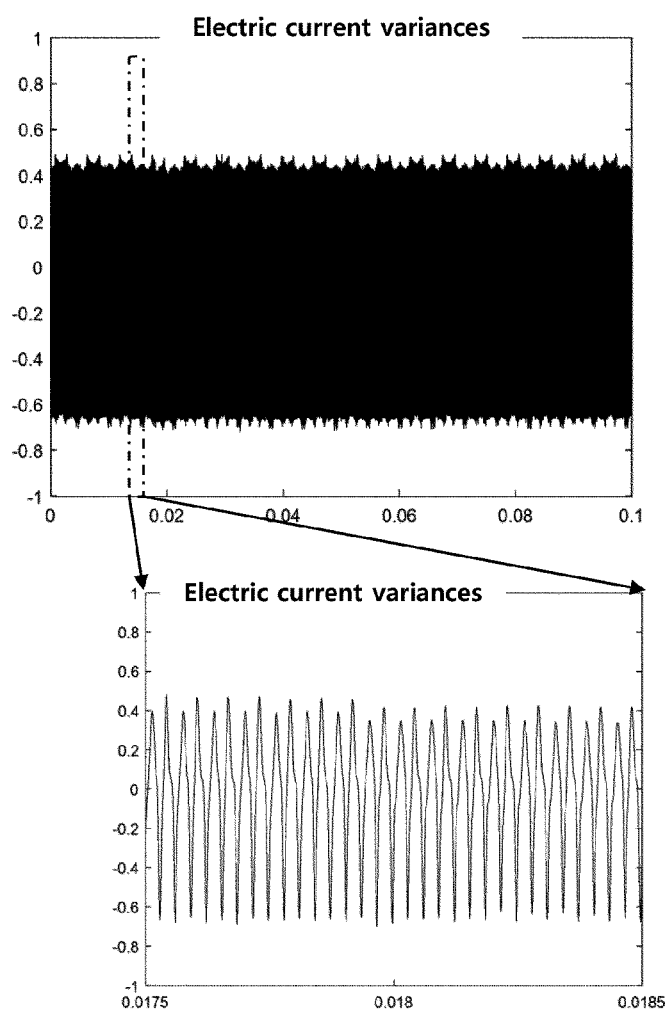
FIG. 4 is a diagram showing a waveform for variances of the electric current in FIG. 3.

FIG. 3 is a diagram showing an electric current waveform in a wire where an arc occurs and FIG. 4 is a diagram showing a waveform for variances of the electric current in FIG. 3.

The electric current waveform in FIG. 3 is obtained from values measured after intentionally generating an arc in a wire and the waveform in FIG. 4 is obtained from the variances of electric currents for respective unit times, calculated using such measured values.

As seen in FIG. 3 and FIG. 4, the variations of electric currents before and after an arc occurrence are not easily discerned due to the noises. A designer may apply a method of reducing such noises to an electric power system. However, since such a method of reducing noises increases costs for manufacturing an electric power system, it is not easy to adopt. In addition, existing electric power systems already have a lot of noises. Accordingly, a technology for determining an arc occurrence in an environment having such noises is required.

According to the first embodiment, in order to more accurately determine an arc occurrence in a noise environment, there is presented a method of determining an arc occurrence in a wire by calculating statistical values for currents flowing in a wire and using such statistical values.

As an example of such statistical values, standard deviation values for variances of electric currents are mainly presented below. However, the present disclosure is not limited to this.

Figure 5:
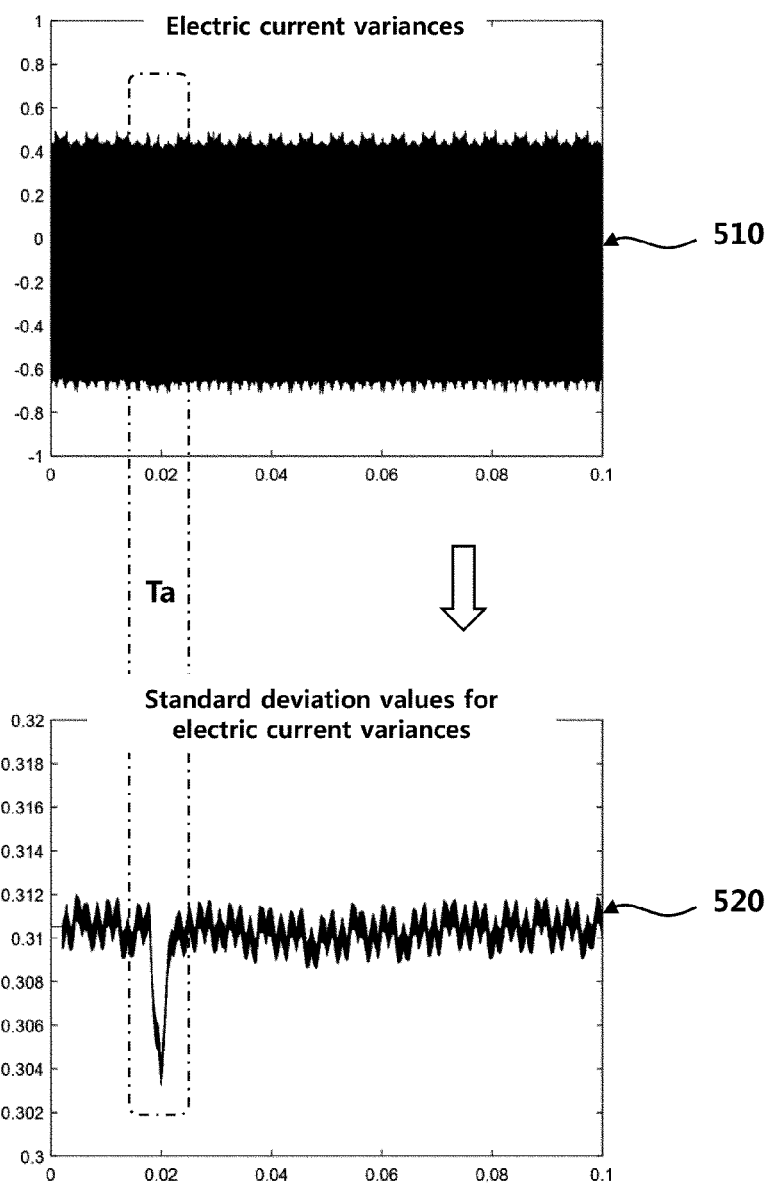
FIG. 5 is a diagram showing a waveform for electric current variances and a waveform of standard deviation values for the electric current variances before and after an arc occurrence.

FIG. 5 is a diagram showing a waveform for electric current variances and a waveform of standard deviation values for the electric current variances before and after an arc occurrence.

Referring to FIG. 5, a first waveform 510 represents variances of electric currents in a wire and a second waveform 520 represents standard deviation values for the variances of electric currents. The arc detection apparatus may calculate standard deviation values of variances of electric currents for respective predetermined time periods or moving standard deviation values for variances of electric currents by moving a moving window along a time axis. The second waveform 520 in FIG. 5 is obtained by applying a calculation method of moving standard deviation values using a moving window to the first waveform 510.

Referring to the first waveform 510, it is not easy to discern differences of waveform values before and after the time point of an arc occurrence Ta. However, referring to the second waveform 520, it can be verified that a waveform value is largely varied at the time point of an arc occurrence Ta. The arc detection apparatus may determine an arc occurrence in a wire using such variations of waveform values of the second waveform.

Here, standard deviation values are an example for statistical values that may be applied to the arc detection apparatus according to the first embodiment. When an arc occurs in a wire, dispersion degrees of values corresponding to electric currents or variances of the electric currents increase with time. Values that may represent such dispersion degrees will suffice as statistical values to be applied to the first embodiment.

Figure 6:
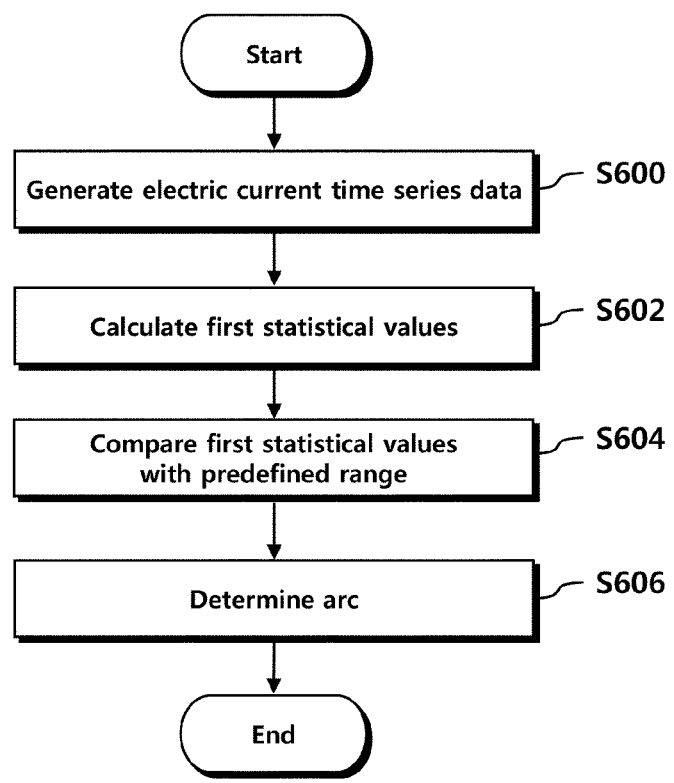
FIG. 6 is a flow diagram of an arc detection method according to a first embodiment.

FIG. 6 is a flow diagram of an arc detection method according to a first embodiment.

Referring to FIG. 6, the arc detection apparatus may generate time series data by measuring electric currents in a wire (S600).

In addition, the arc detection apparatus may calculate first statistical values indicating dispersion degrees of values corresponding to electric currents or variances of the electric currents (S602). The first statistical values may be calculated for respective predetermined time periods or along the moving window. The first statistical values may be standard deviation values or dispersion values.

For example, the arc detection apparatus may obtain first statistical values by calculating variances of electric currents flowing in a wire using variances of electric currents for respective unit times and calculating standard deviation values for the variances of electric currents. For another example, the arc detection apparatus may obtain the first statistical values by calculating standard deviation values for measured values of electric currents to which a low-pass filter is applied.

The arc detection apparatus may compare the first statistical values with a predefined range (S604) and determine that the possibility of an arc occurrence in the wire is high (S606) in a case when at least one the first statistical values is out of the predefined range. When the arc detection apparatus uses only one condition to determine an arc occurrence, the arc detection apparatus may determine the arc occurrence by comparing the first statistical values with the predefined range. However, when the arc detection apparatus uses multiple conditions to determine the arc occurrence, the arc detection apparatus may use the first statistical values as an element for determining the arc occurrence. For example, the arc detection apparatus may use the first statistical values in a way in which the arc detection apparatus compares the first statistical values with the predefined range, and increases an indicator value for the possibility of the arc occurrence or sets a flag regarding an arc in a case when at least one of the first statistical values is out of the predefined range. Even when the possibility of the arc occurrence is determined to be high using the first statistical values, another condition may reveal, as the final determination, that no arc occurs.

The arc detection method may further comprise a step of establishing a predefined range (not shown). The arc detection apparatus may adaptively establish a predefined. range. For example, the arc detection apparatus may establish a predefined range to be wide in an electric power system or an environment having a lot of noises and to be narrow in an electric power system or an environment having less noises.

The arc detection apparatus may establish a predefined range having an upper and a lower boundary by calculating average values of the first statistical values, calculating second statistical values indicating dispersion degrees of the first statistical values, and adding or subtracting values corresponding to K (K is a positive real number) times of the second statistical values to or from the average values of the first statistical values.

Figure 7:
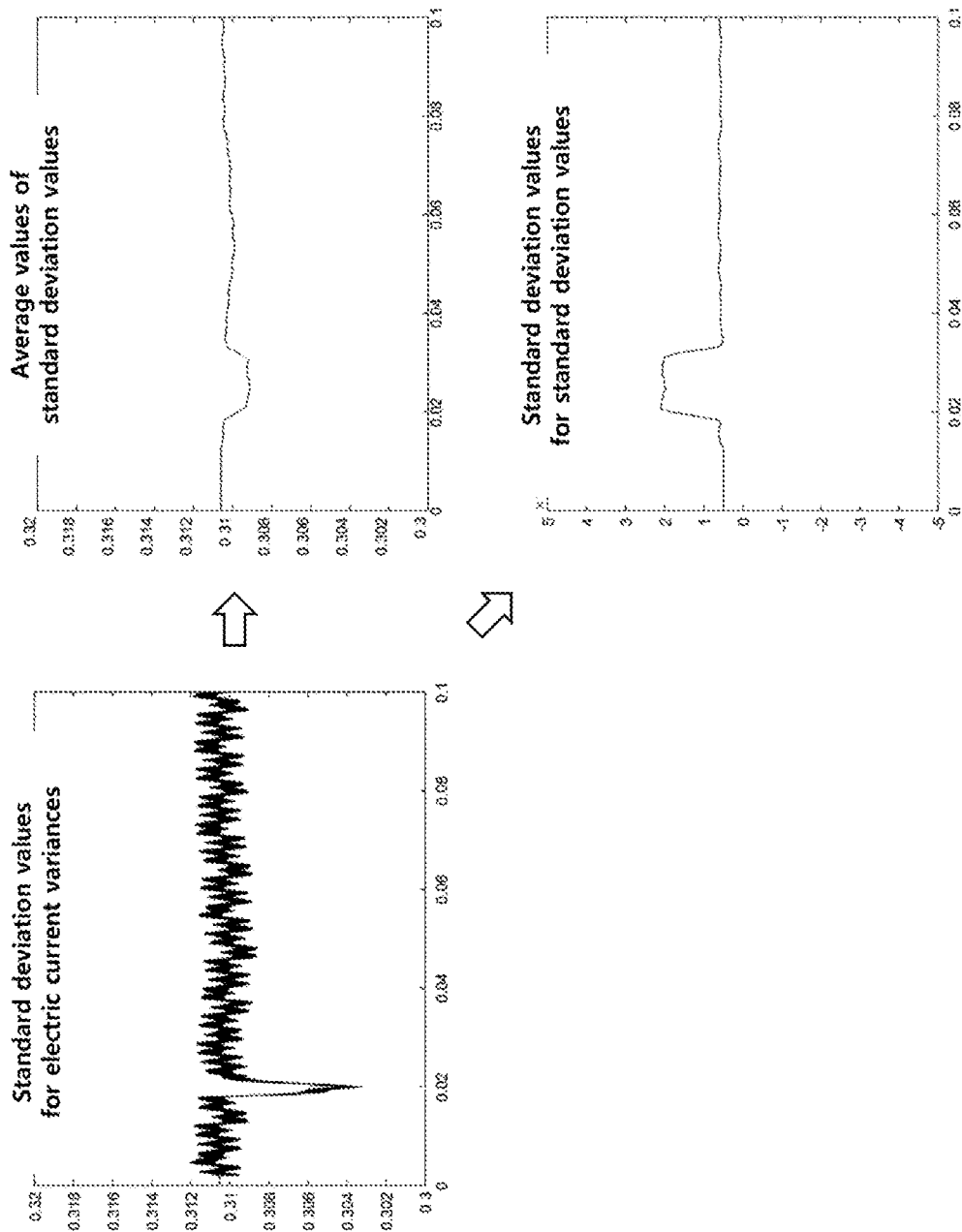
FIG. 7 is a diagram showing a waveform for average values of standard deviation values for electric current variances and a waveform for standard deviation values for standard deviation values for electric current variances.
Figure 8:
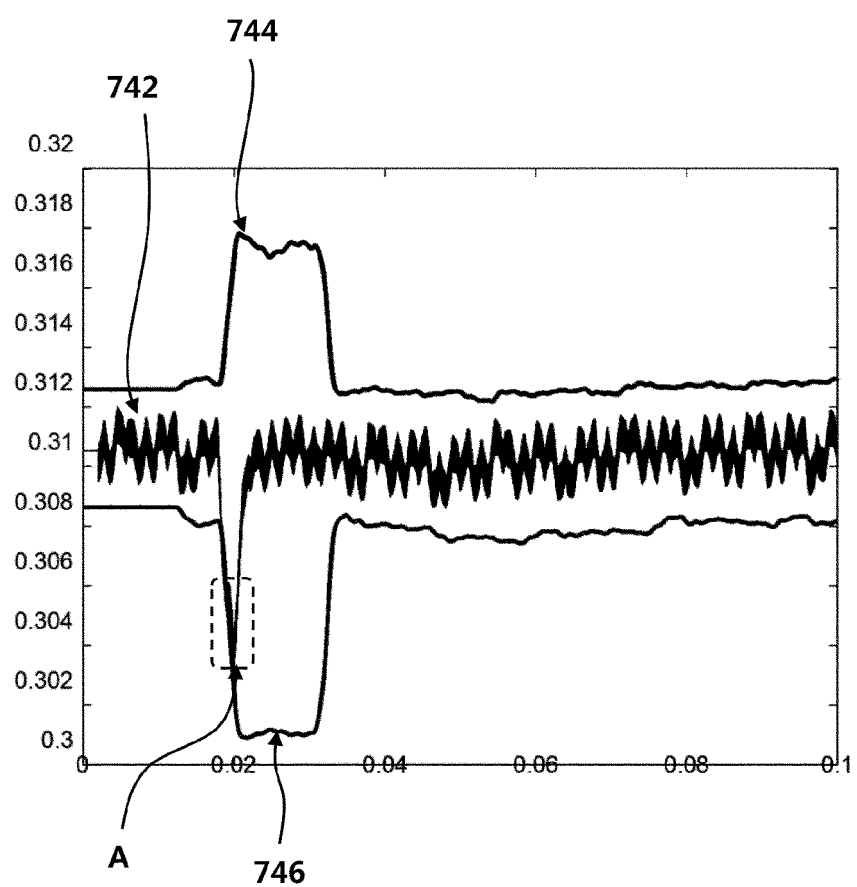
FIG. 8 is a diagram showing the waveforms of FIG. 7 combined in one graph.

FIG. 7 is a diagram showing a waveform for average values of standard deviation values for electric current variances and a waveform for standard deviation values for standard deviation values for electric current variances and FIG. 8 is a diagram showing the waveforms of FIG. 7 combined in one graph.

Referring to FIG. 7, the arc detection apparatus may calculate statistical deviation values for variances of electric currents as the first statistical values and standard deviation values for the first statistical values as the second statistical values. The arc detection apparatus may periodically calculate the first statistical values and the second statistical values using a timer comprised therein.

The arc detection apparatus may establish a predefined range by calculating average values of the first statistical values and adding or subtracting values corresponding to K times of the second statistical values to or from the average values. The arc detection apparatus may periodically calculate predefined ranges using the timer. Such periodic calculations allow the arc detection apparatus to calculate in real time first statistical values and a predefined range for each period.

The arc detection apparatus may compare first statistical values with a predefined range, both calculated in real time and determine that the possibility of an arc occurrence in a wire is high in a case when at least one of the first statistical values is out of the predefined range.

In FIG. 8, a first waveform 742 represents the first statistical values, a second waveform 744, obtained by adding K times of the second statistical values to the first statistical values, represents an upper boundary of the predefined range, and a third waveform 746, obtained by subtracting K times of the second statistical values from the first statistical values, represents a lower boundary of the predefined range. The arc detection apparatus may determine a time point when at least one of the first statistical values is out of the predefined range as shown in A time point in FIG. 8 as a time point of an arc occurrence.

The arc detection apparatus may adjust the predefined range using K value. For example, the arc detection apparatus may establish the predefined range to be wide by increasing the K value or to be narrow by decreasing the K value. The arc detection apparatus may adjust the K value depending on average values of the first statistical values. For example, the arc detection apparatus may increase the K value as the average values of the first statistical values are lesser and decrease the K value as the average values of the first statistical values are greater.

In the above, examples of calculating the first statistical values and the second statistical values using the variances of electric currents are mainly described. However, the arc detection apparatus may calculate the first statistical values and the second statistical values using other values regarding electric currents.

For example, the arc detection apparatus may obtain the first statistical values by calculating standard deviation values for measured values of electric currents to which a low-pass filter is applied.

Figure 9:
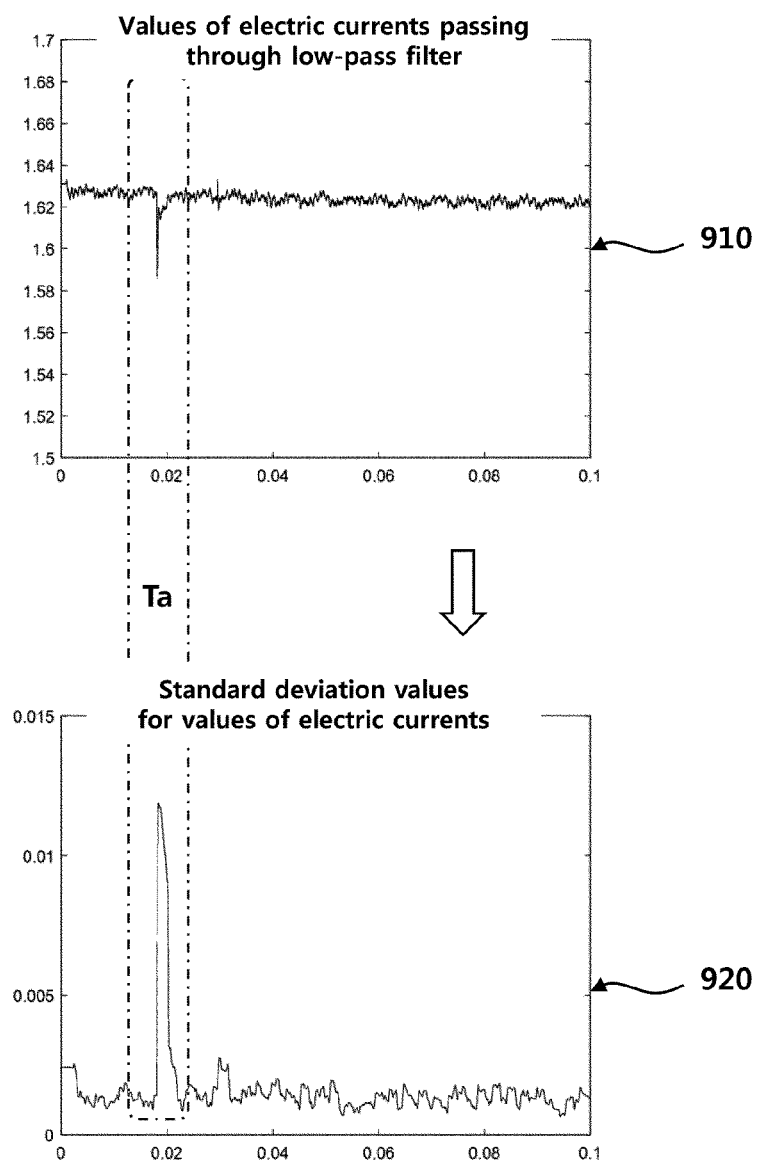
FIG. 9 is a diagram showing a waveform for measured values of an electric current to which a low-pass filter is applied and a waveform of standard deviation values calculated from the aforementioned waveform.

FIG. 9 is a diagram showing a waveform for measured values of an electric current to which a low-pass filter is applied and a waveform of standard deviation values calculated from the aforementioned waveform.

In FIG. 9, a first waveform 910 represents measured values of electric currents to which a low-pass filter is applied and a second waveform 920 represents standard deviation values for the measured values of the electric currents to which the low-pass filter is applied. As shown in FIG. 9, the standard deviation values at the time point of an arc occurrence Ta are sharply varied.

Figure 10:
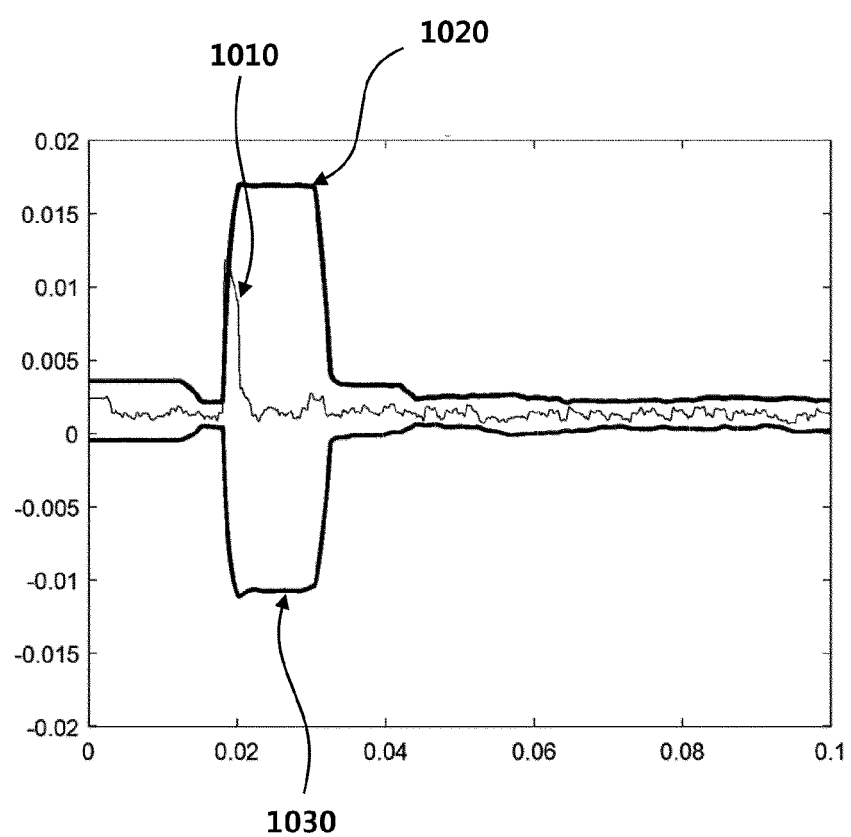
FIG. 10 is a diagram showing a waveform for standard deviation values for measured values of an electric current to which a low-pass filter is applied and a relevant predefined range.

FIG. 10 is a diagram showing a waveform for standard deviation values for measured values of an electric current to which a low-pass filter is applied and a relevant predefined range.

In FIG. 10, a first waveform 1010 represents standard deviation values for measured values of electric currents to which a low-pass filter is applied, a second waveform 1020 represents an upper boundary of a predefined range, and a third waveform 1030 represents a lower boundary of the predefined range.

The arc detection apparatus may calculate standard deviation values for measured values of electric currents to which the low-pass filter is applied as first statistical values and standard deviation values for the first statistical values as second statistical values. The arc detection apparatus may establish a predefined range using the second statistical values and determine that the possibility of an arc occurrence in a wire is high in a case when at least one of the first statistical values is out of the predefined range.

The arc detection apparatus may further use additional conditions for determining an arc occurrence in order to minimize the mis-determination of an arc occurrence.

For example, the arc detection apparatus may calculate average values of the first statistical values and determine that there is a sharp variation in operating currents in a wire in a case when at least one of the average values of the first statistical values is sharply varied, in other words, the average values of the first statistical values are varied to be higher than a predetermined reference value, before and after the time point when at least one of the first statistical values is out of the predefined range. In this case, the arc detection apparatus may determine that the possibility of an arc occurrence is low.

For another example, the arc detection apparatus may determine the possibility of an arc occurrence by comparing frequency content values of values corresponding to electric currents in a wire in predetermined time periods before and after the time point when at least one of the first statistical values is out of the predefined range.

Second Embodiment

The arc determination circuit shown in FIG. 1 (see 114 in FIG. 1) may generate N (N is a natural number, which is 2 or higher) pieces of frequency analysis data by performing N times or more of frequency analyses for time series data in different time periods and determine that an arc occurs in the wire (see 120 in FIG. 1) or that the possibility of an arc occurrence in the wire (see 120 in FIG. 1) is high in a case when at least one of FFT magnitude variation values of respective frequencies, verified in the N pieces of frequency analysis data, exceeds a reference value.

Figure 11:
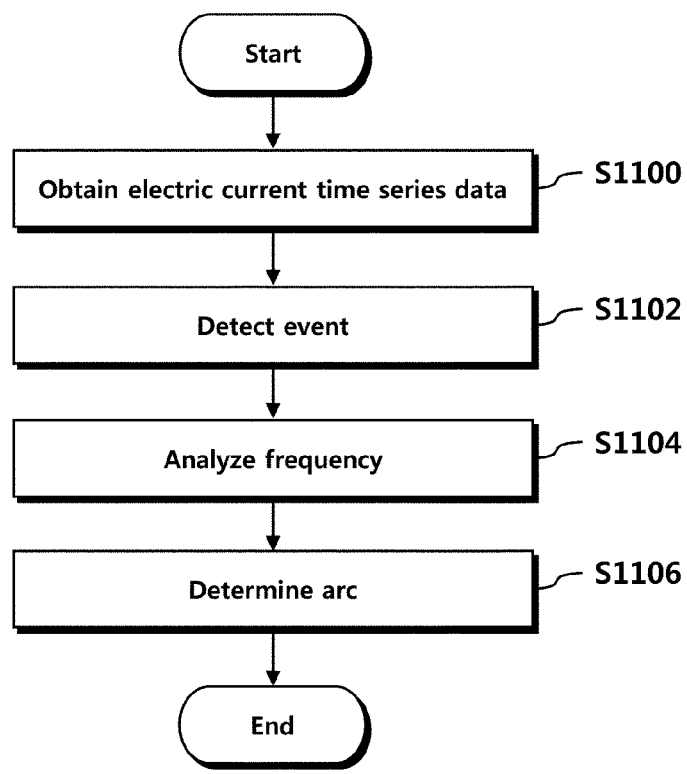
FIG. 11 is a flow diagram of a first example of an arc detection method according to a second embodiment.

FIG. 11 is a flow diagram of a first example of an arc detection method according to a second embodiment.

Referring to FIG. 11, the arc detection apparatus may obtain time series data for measured values of electric currents flowing in a wire (S1100).

Then, the arc detection apparatus may detect an event (S1102). The event may be generated internally or by external signals. The external signals may be, for example, signals generated by a user's operation or signals transmitted from other devices.

The event may internally be generated. For example, the event may periodically be generated by a timer, or by the arc detection apparatus when a specific condition is satisfied. The specific condition may be related with an arc occurrence. For example, the arc detection apparatus may generate an event when at least one of variances of electric currents flowing in a wire exceeds a reference value. For another example, the arc detection apparatus may calculate standard deviation values for variances with time of electric currents from time series data and generate an event when at least one of standard deviation values exceeds a predefined range.

When an event is detected, the arc detection apparatus may perform a frequency analysis for the time series data (S1104) and determine an arc occurrence in a wire using frequency analysis results (S1106).

Figure 12:
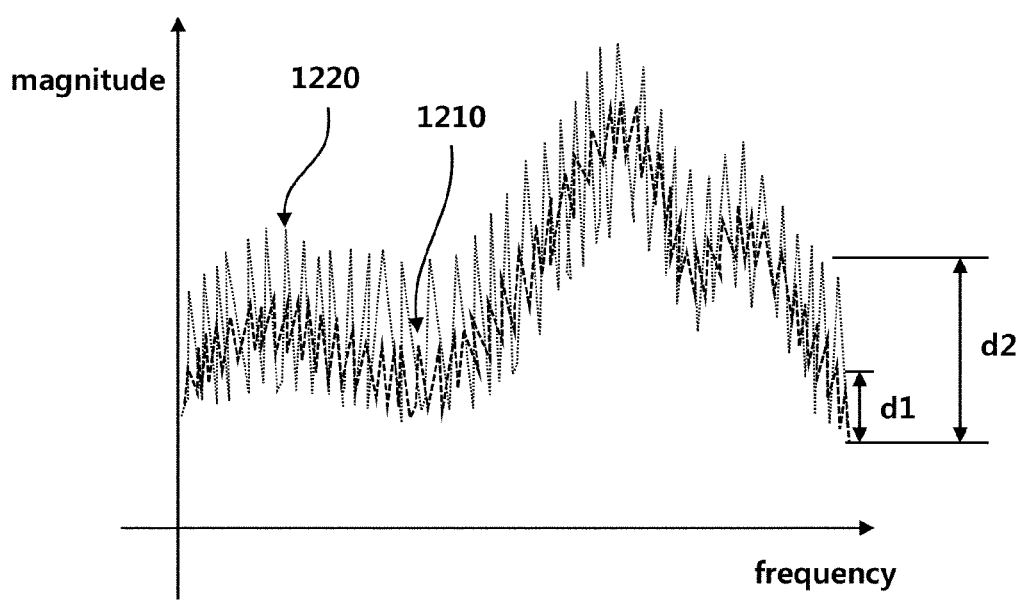
FIG. 12 is a diagram showing results of frequency analysis for electric currents before and after an arc occurrence.

FIG. 12 is a diagram showing results of frequency analysis for electric currents before and after an arc occurrence.

In FIG. 12, a first curve 1210 shows results of the application of the FFT to measured values of electric currents before an arc occurrence represented in a frequency domain and a second curve 1220 shows results from the application of the FFT to measured values of an electric current after an arc occurrence represented in the frequency domain.

The arc detection apparatus may generate an event at a time point when an arc is supposed to occur and determine an arc occurrence by comparing the frequency analysis results for electric currents obtained before the event with the frequency analysis results for electric currents obtained after the event. Here, the arc detection apparatus generally determines the arc occurrence by comparing magnitudes of respective frequencies in a specific frequency band from the frequency analysis results. However, since the magnitudes of the respective frequencies of the first curve 1210 and the second curve 1220 are mostly similar as shown in FIG. 12, it is not easy to determine an arc occurrence by comparing the magnitudes.

To resolve such a problem, the arc detection apparatus according to the second embodiment may determine an arc occurrence by comparing variances of FFT magnitudes of the frequency analysis data obtained before and after an arc occurrence.

Referring to FIG. 12, variances d2 of FFT magnitudes of the second curve corresponding to after the arc occurrence is greater than variances d1 of FFT magnitudes of the first curve corresponding to before the arc occurrence. The arc detection apparatus may determine an arc occurrence by calculating values that can represent such variances of FFT magnitudes and using these values.

Test results for an arc detection method according to the second embodiment are shown in FIG. 13 to FIG. 16.

Figure 13:
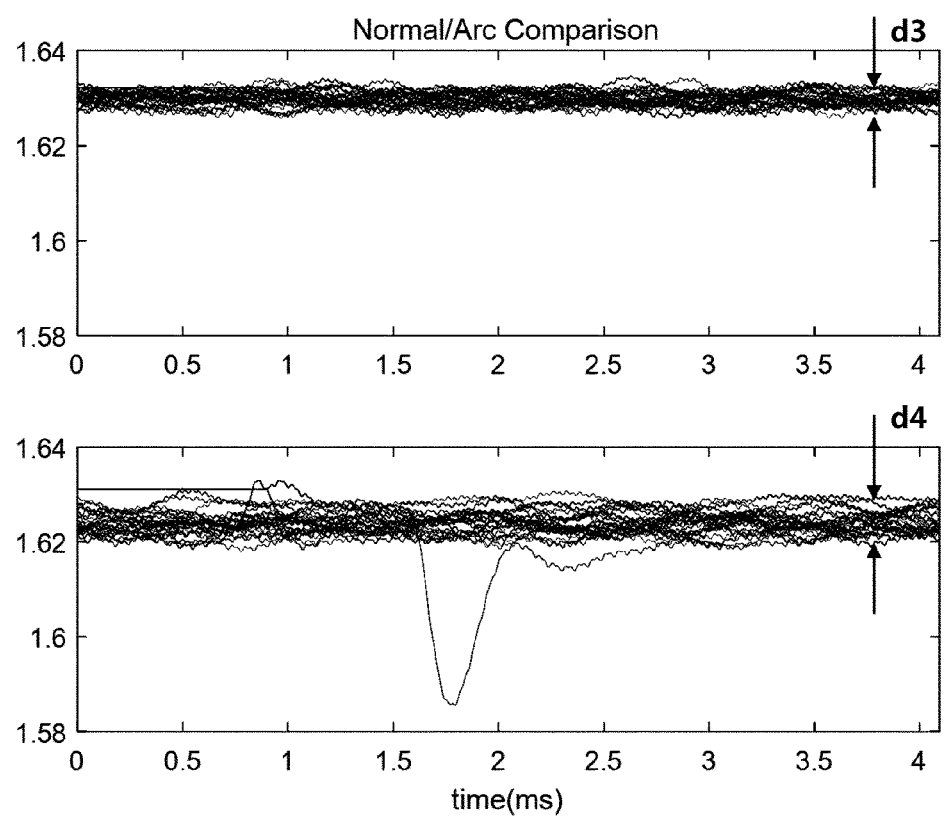
FIG. 13 is a diagram showing waveforms for measured values of electric currents before and after an arc occurrence.

FIG. 13 is a diagram showing waveforms for measured values of electric currents before and after an arc occurrence.

In FIG. 13, a waveform (Normal) shown in an upper part of FIG. 13 represents measured values before an arc occurrence, whereas a waveform (Arc) shown in a lower part of FIG. 13 represents measured values after the arc occurrence. When comparing the two waveforms, a range of fluctuations d4 of the waveform in the lower part are greater than a range of fluctuations d3 of the waveform in the upper part.

Such a difference between the ranges of fluctuations depending on an arc occurrence can also be seen in results of the application of the FFT.

Figure 14:
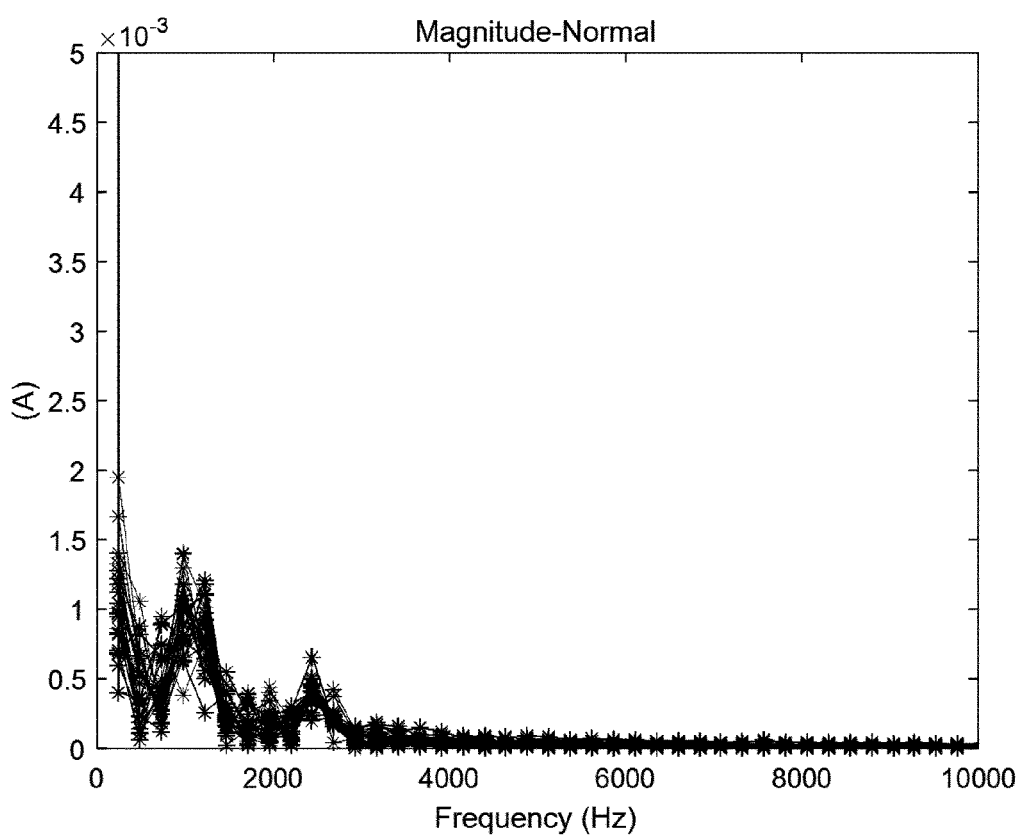
FIG. 14 shows graphs of a result of an application of the fast Fourier transform (FFT) to measured values of an electric current before an arc occurrence.
Figure 15:
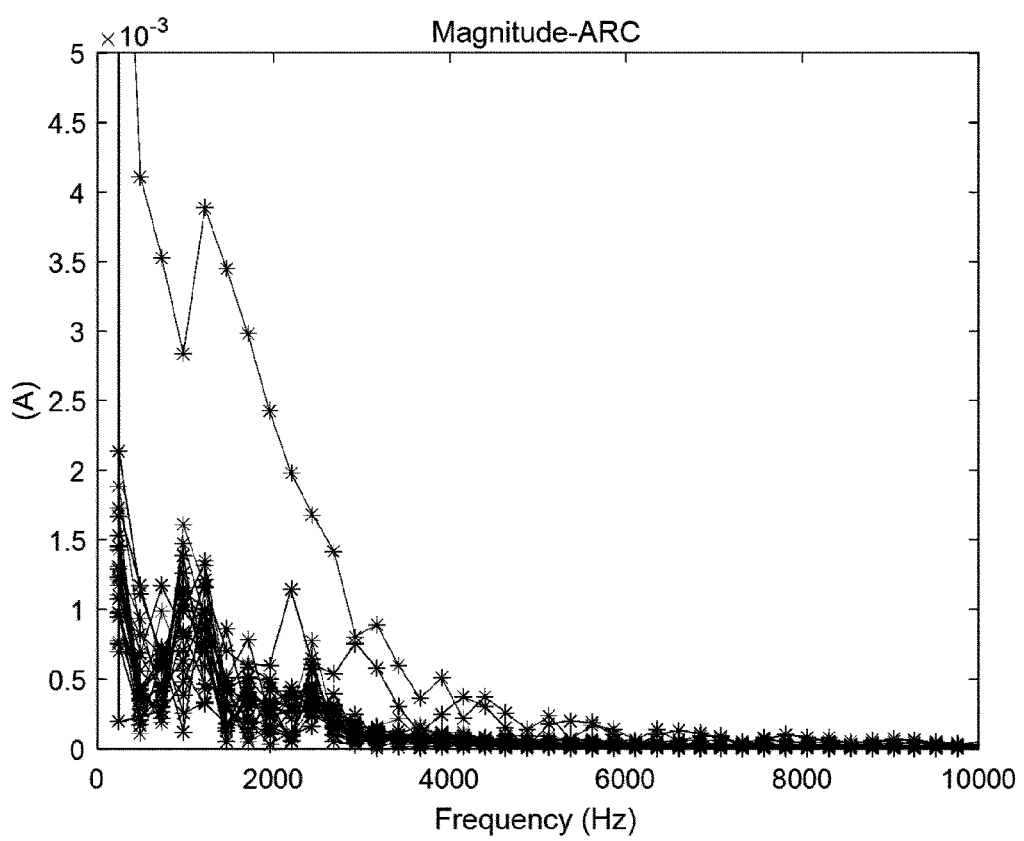
FIG. 15 shows graphs of a result of an application of the FFT to measured values of an electric current after an arc occurrence.

FIG. 14 shows graphs of a result of an application of the fast Fourier transform (FFT) to measured values of an electric current before an arc occurrence and FIG. 15 shows graphs of a result of an application of the FFT to measured values of an electric current after an arc occurrence.

FIG. 14 and FIG. 15 respectively illustrate multiple FFT results performed in different time periods, not one FFT result.

When comparing FIG. 14 and FIG. 15, the FFT results (ARC) after an arc occurrence illustrated in FIG. 15 show sharper fluctuations than the FFT results (Normal) before the arc occurrence illustrated in FIG. 14.

The arc detection apparatus may calculate variation values of the FFT magnitudes of the respective frequencies and determine that an arc occurs when the variation values are greater than a reference value.

Figure 16:
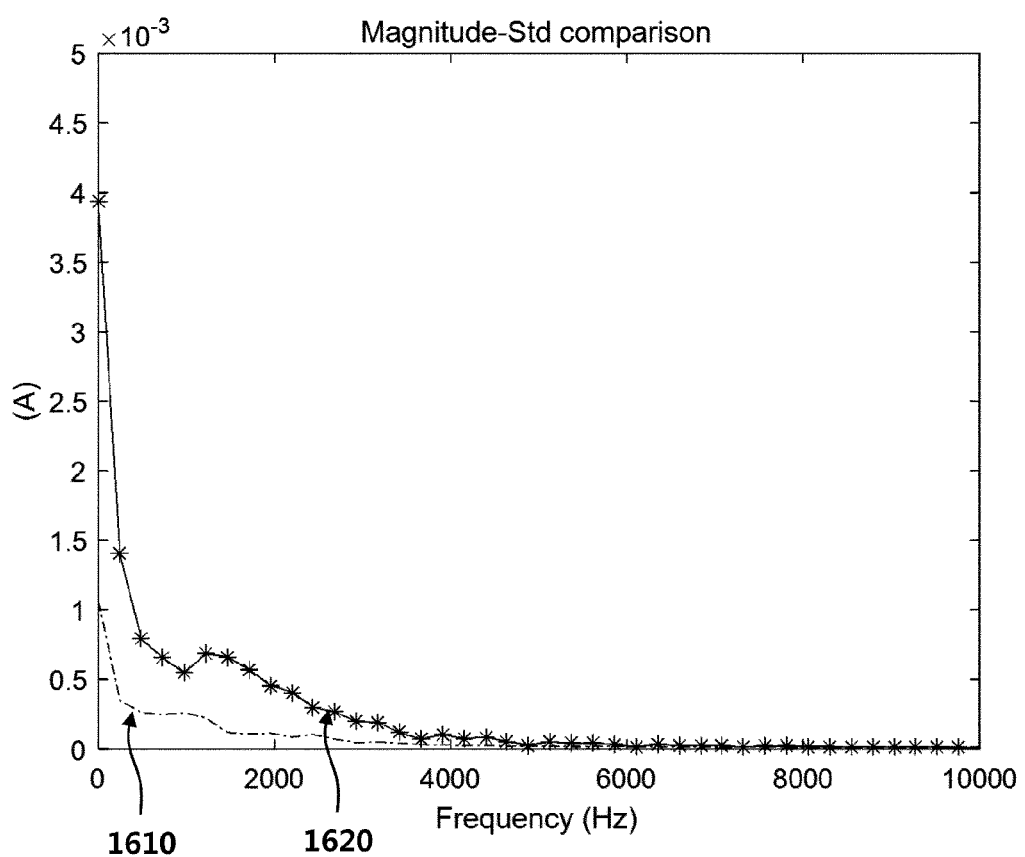
FIG. 16 is a diagram showing standard deviation values for magnitude variation values of respective frequencies in the FFT results before and after an arc occurrence.

FIG. 16 is a diagram showing standard deviation values for magnitude variation values of respective frequencies in the FFT results before and after an arc occurrence.

In FIG. 16, a first curve 1610 represents standard deviation values for magnitude variation values of respective frequencies obtained from the FFT results before an arc occurrence, whereas a second curve 1620 represents standard deviation values for magnitude variation values of respective frequencies obtained from the FFT results after the arc occurrence.

When comparing the first curve 1610 and the second curve 1620, the standard deviation values for the magnitude variation values of respective frequencies increase after the arc occurrence. In order to check the magnitude variations of respective frequencies, the arc detection apparatus may calculate the standard deviation values for the magnitude variation values of respective frequencies and use them.

Figure 17:
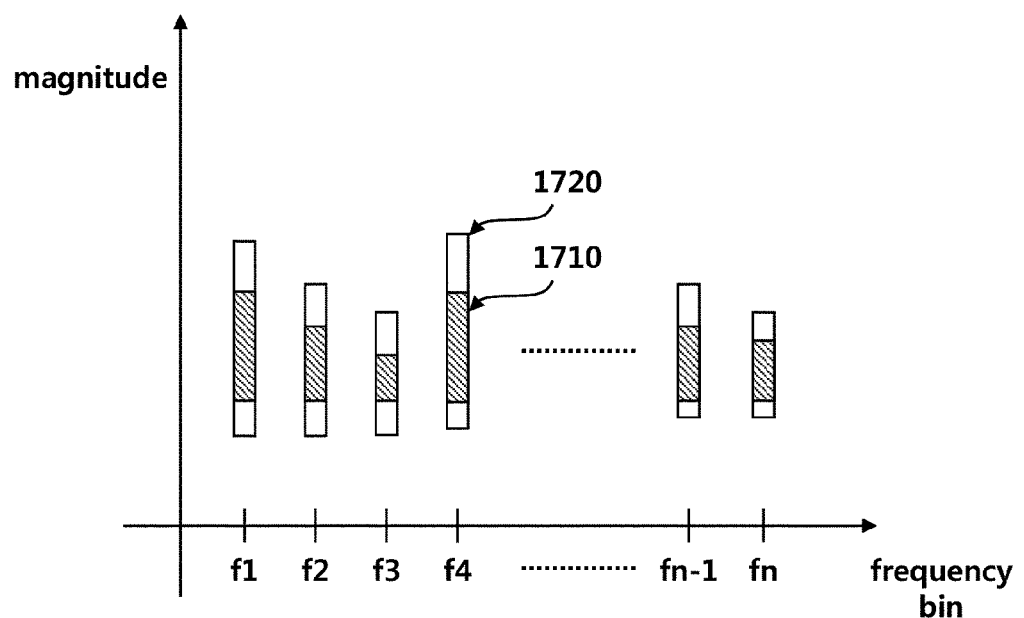
FIG. 17 is a diagram showing magnitude variations of respective frequency bins in the FFT results before and after an arc occurrence.

FIG. 17 is a diagram showing magnitude variations of respective frequency bins in the FFT results before and after an arc occurrence.

When performing the FFT in a discrete way, the FFT results may be obtained by a frequency bin.

In FIG. 17, a first figure 1710 represents magnitude variations for respective frequency bins in the FFT results for measured values of electric currents before an arc occurrence, whereas a second figur 1720 represents magnitude variations for respective frequency bins in the FFT results for measured values of electric currents after the arc occurrence.

As shown in FIG. 17, when an arc occurs, the magnitude variations for respective frequency bins become large, then, the arc detection apparatus may determine an arc occurrence by comparing each magnitude variation value for each frequency bin with a reference value.

The reference value, which is a criterion for comparison, may adaptively be calculated. The arc detection apparatus may store a fixed value as the reference value or calculate references values for use depending on the situation. For example, the arc detection apparatus may perform a frequency analysis for measured values in every predetermined time period, calculate a value representing a magnitude variation for each frequency bin from each frequency analysis, and store it. Then, the arc detection apparatus may identify an event for an arc and use, as a reference value, a value indicating a magnitude variation for each frequency bin calculated and stored before the event. According to such a method, the reference value may continuously vary and adaptively be calculated depending on the situation of an electric power system in which the arc detection is carried out.

Figure 18:
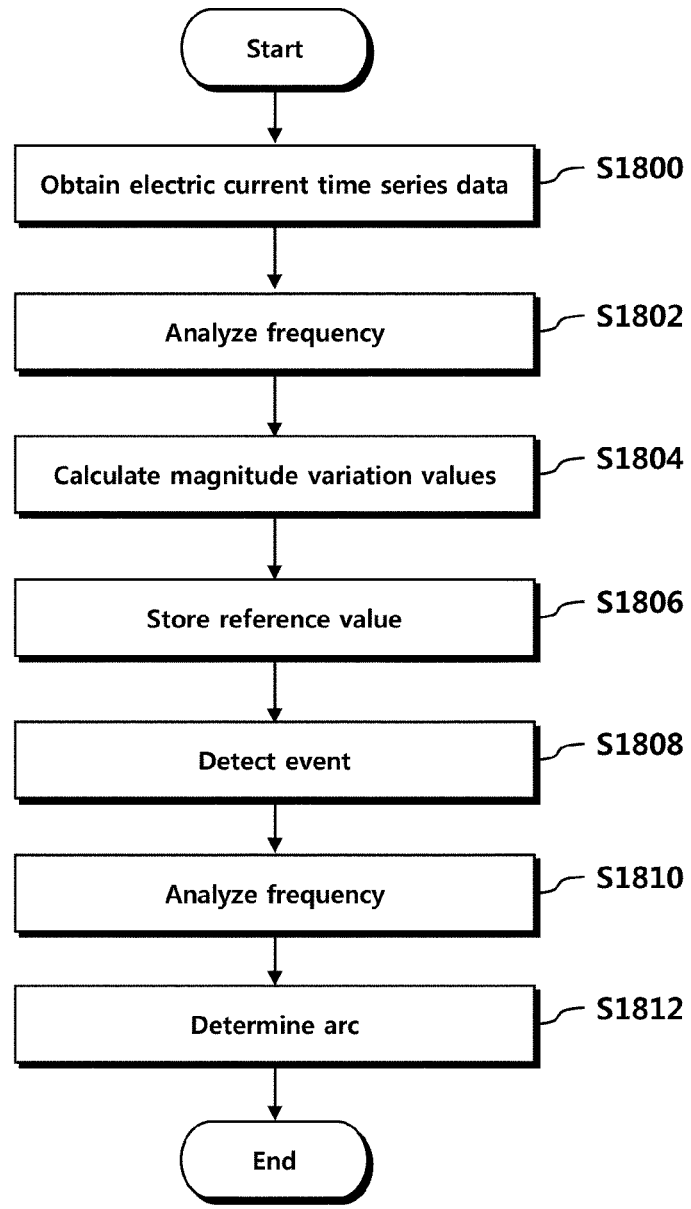
FIG. 18 is a flow diagram of a second example of an arc detection method according to a second embodiment.

FIG. 18 is a flow diagram of a second example of an arc detection method according to a second embodiment.

Referring to FIG. 18, the arc detection apparatus may obtain time series data for measured values of electric currents flowing in a wire (S1800).

The arc detection apparatus may perform a frequency analysis for the time series data in every predetermined time period and generate frequency analysis data (S1802).

The arc detection apparatus may calculate magnitude variation values for respective frequencies using M (M is a natural number, which is 2 or higher) pieces of frequency analysis data (S1804). For example, the arc detection apparatus may calculate a difference between a maximum value and a minimum value of a magnitude for each frequency as a magnitude variation value. For another example, the arc detection apparatus may calculate standard deviation values for the magnitudes for respective frequencies as variation values.

The arc detection apparatus may store a calculated magnitude variation value for each frequency as a reference value (S1806).

The arc detection apparatus may detect an event related to an arc (S1808). For example, the arc detection apparatus may calculate standard deviation values for variances with time of electric currents from the time series data, and then, generate an event, and detect the event in a case when at least one of the standard deviation values is out of a predefined range.

When the event is detected, the arc detection apparatus may perform N is a natural number, which is 2 or higher) times or more of frequency analyses in different time periods and generate N pieces of frequency analysis data (S1810).

Then, in a case when at least one of the magnitude variation values for respective frequencies verified in the N pieces of frequency analysis data exceeds a reference value, the arc detection apparatus may determine that an arc occurs in a wire or the possibility arc occurrence in a wire is high.

Since terms, such as "including," "comprising," and "having" mean that corresponding elements may exist unless they are specifically described to the contrary, it shall he construed that other elements can be additionally included, rather than that such elements are omitted. All technical, scientific or other terms are used consistently with the meanings as understood by a person skilled in the art unless defined to the contrary. Common terms as found in dictionaries should be interpreted in the context of the related technical writings, rather than overly ideally or impractically, unless the present disclosure expressly defines them so.

Although a preferred embodiment of the present disclosure has been described for illustrative purposes, those skilled in the art will appreciate that various modifications, additions and substitutions are possible, without departing from the scope and spirit of the embodiment as disclosed in the accompanying claims. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. An arc detection method, in which an apparatus detects arcs, comprising steps of:
   obtaining time series data for measured values of an electric current flowing in a wire;
   generating N pieces of frequency analysis data by performing N times or more of frequency analyses in different time periods of the time series data, wherein N is a natural number which is 2 or higher; and
   determining that an arc occurs in the wire or that the possibility of an arc occurrence in the wire is high in a case when at least one of magnitude variation values of frequencies, verified in the N pieces of frequency analysis data, exceeds a reference value.

2. The arc detection method of claim 1 further comprising a step of calculating statistical values for the dispersion or standard deviation values of magnitudes of respective frequencies in the N pieces of frequency analysis data, and determining that an arc occurs in the wire or the possibility of an arc occurrence in the wire is high in a case when at least one of the statistical values exceeds the reference value.

3. The arc detection method of claim 1 further comprising steps of:
   before generating the N pieces of frequency analysis data, generating M pieces of frequency analysis data by performing M times or more of frequency analyses in different time periods of the time series data, wherein M is a natural number which is 2 or higher; and
   generating the reference value by calculating a magnitude variation value for each frequency using the M pieces of frequency analysis data.

4. The arc detection method of claim 3, wherein the reference value is generated in a time period in which it was determined that no arc occurs.

5. The arc detection method of claim 3, wherein the reference value is generated within a predetermined time after a relevant apparatus has started to operate.

6. The arc detection method of claim 3, wherein the M pieces of frequency analysis data are generated using the time series data before a time point when an instantaneous value of the electric current is varied and the N pieces of frequency analysis data are generated using the time series data after the time point.

7. The arc detection method of claim 3, wherein the M pieces of frequency analysis data are generated using the time series data before the time point when at least one of the dispersion degrees of values corresponding to the electric current or the variances of the electric current is out of a predefined range and the N pieces of frequency analysis data are generated using the time series data after the time point.

8. The arc detection method of claim 1, wherein the N pieces of frequency analysis data are generated in time periods of the same size and not overlapping with each other.

9. An arc detection apparatus comprising:
a sensing circuit to obtain time series data for measured values of an electric current flowing in a wire; and
an arc determination circuit to generate N pieces of frequency analysis data by performing N times or more of frequency analyses in different time periods, and to determine that an arc occurs in the wire or that the possibility of an arc occurrence in the wire is high in a case when at least one of magnitude variation values of respective frequencies, verified in the N pieces of frequency analysis data, exceeds a reference value, wherein N is a natural number which is 2 or higher.

10. The arc detection apparatus of claim 9, wherein switching noises of a power converting device flow in through one side of the wire.

11. The arc detection apparatus of claim 9, wherein the arc determination circuit generates the reference value by generating M (M is a natural number, which is 2 or higher) pieces of frequency analysis data by performing M times or more of frequency analyses for the time series data in a time period before an event is generated and calculating magnitude variation values for respective frequencies using the M pieces of frequency analysis data.

12. The arc detection apparatus of claim 11, wherein the event is generated by a timer or an external signal.

13. The arc detection apparatus of claim 11, wherein the arc determination circuit discerns a variation of an instantaneous value of the electric current to generate the event.

14. The arc detection apparatus of claim 11, wherein the arc determination circuit generates the event in a case when at least one of the dispersion degrees of values corresponding to the electric current or variances of the electric current is out of the predefined range.

15. The arc detection apparatus of claim 11, wherein the sensing circuit generates the time series data using the measured values of the electric current to which a low-pass filter is applied.

* * * * *